United States Patent
Thiagarajan et al.

(10) Patent No.: US 9,998,105 B2
(45) Date of Patent: Jun. 12, 2018

(54) PROGRAMMABLE SWITCHED CAPACITOR BLOCK

(71) Applicant: Cypress Semiconductor Corporation, San Jose, CA (US)

(72) Inventors: Eashwar Thiagarajan, Bellevue, WA (US); Harold Kutz, Edmonds, WA (US); Jaskarn Singh Johal, Mukilteo, WA (US); Erhan Hancioglu, Bothell, WA (US); Hans Klein, Pleasanton, CA (US); Bruce Byrkett, Preston, WA (US); Mark Hastings, Mukilteo, WA (US); Dennis Seguine, Temecula, CA (US); Kendall Castor-Perry, Seattle, WA (US); Monte Mar, Issaquah, WA (US); Gajender Rohilla, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 96 days.

(21) Appl. No.: 14/493,635

(22) Filed: Sep. 23, 2014

(65) Prior Publication Data

US 2015/0349768 A1    Dec. 3, 2015

Related U.S. Application Data

(60) Provisional application No. 62/005,532, filed on May 30, 2014.

(51) Int. Cl.
*H03M 1/12* (2006.01)
*H03K 17/00* (2006.01)
(Continued)

(52) U.S. Cl.
CPC ............. *H03K 17/00* (2013.01); *H03M 1/068* (2013.01); *H03M 1/442* (2013.01); *H03M 1/468* (2013.01)

(58) Field of Classification Search
CPC .... H03M 1/442; H03M 1/068; H03M 1/0682; H03M 1/468
(Continued)

(56) References Cited

U.S. PATENT DOCUMENTS 5,220,286 A    6/1993  Nadeem
5,359,294 A    10/1994 Ganger et al.
(Continued)

FOREIGN PATENT DOCUMENTS

CN    101194416 A    6/2008
CN    102483721 A    5/2012
(Continued)

OTHER PUBLICATIONS

International Search Report for International Application No. PCT/US15/33135 dated Sep. 14, 2015; 2 pages.
(Continued)

*Primary Examiner* — Linh Nguyen
(74) *Attorney, Agent, or Firm* — Lowenstein Sandler LLP

(57) ABSTRACT

A first analog block includes a first plurality of switched capacitors and a second analog block includes a second plurality of switched capacitors. A switch associated with the first plurality of switched capacitors as well as a switch associated with the second plurality of switched capacitors may be configured based on one or more analog functions. The configuring of the first analog and the second analog block may include the configuring of the switch associated with the first plurality of switched capacitors when the analog function is associated with a first single ended signal and the configuring of both the switch associated with the (Continued)

first plurality of switched capacitors and the switch associated with the second plurality of switched capacitors when the analog function is associated with a differential signal.

20 Claims, 9 Drawing Sheets

(51) Int. Cl.
    *H03M 1/44*     (2006.01)
    *H03M 1/46*     (2006.01)
    *H03M 1/06*     (2006.01)

(58) Field of Classification Search
    USPC .......................................... 341/122, 150, 172
    See application file for complete search history.

(56) References Cited

U.S. PATENT DOCUMENTS

| | | | |
|---|---|---|---|
| 5,608,345 | A | 3/1997 | MacBeth et al. |
| 5,617,093 | A | 4/1997 | Klein |
| 5,654,984 | A | 8/1997 | Hershbarger et al. |
| 5,973,536 | A | 10/1999 | Maejima |
| 6,037,887 | A * | 3/2000 | Wu ........................ H03M 3/486 341/139 |
| 6,243,776 | B1 | 6/2001 | Lattimore et al. |
| 6,377,084 | B1 | 4/2002 | Forbes |
| 6,819,178 | B2 | 11/2004 | Pihistrom et al. |
| 6,836,290 | B1 | 12/2004 | Chung et al. |
| 7,449,951 | B2 | 11/2008 | Oh |
| 7,843,232 | B2 | 11/2010 | Farhat et al. |
| 8,139,674 | B2 | 3/2012 | Jaso |
| 8,198,937 | B1 | 6/2012 | Boas et al. |
| 8,306,494 | B2 | 11/2012 | Ojo |
| 8,446,988 | B2 | 5/2013 | Chung et al. |
| 8,860,599 | B1 | 10/2014 | Lien |
| 2002/0149508 | A1* | 10/2002 | Hamashita ............ H03M 3/496 341/172 |
| 2003/0171107 | A1 | 9/2003 | Sorrells et al. |
| 2004/0246162 | A1* | 12/2004 | Leung ................. H03M 1/1057 341/172 |
| 2005/0219097 | A1 | 10/2005 | Atriss et al. |
| 2006/0284754 | A1* | 12/2006 | Garrity ............... H03M 1/1225 341/172 |
| 2008/0018514 | A1* | 1/2008 | Ryu ........................ H03M 1/06 341/150 |
| 2008/0129576 | A1* | 6/2008 | Jeon .................... H03M 1/0682 341/172 |
| 2009/0102695 | A1* | 4/2009 | Kawahito ............... H03M 1/08 341/172 |
| 2009/0185406 | A1 | 7/2009 | Uno |
| 2010/0141499 | A1* | 6/2010 | Mathe ................... H03M 1/462 341/172 |
| 2010/0142653 | A1 | 6/2010 | Furuta et al. |
| 2010/0179977 | A1* | 7/2010 | Wei ...................... H03H 19/004 708/313 |
| 2010/0308870 | A1* | 12/2010 | Kumakura .............. H03F 3/005 327/56 |
| 2011/0006937 | A1 | 1/2011 | Zoso |
| 2011/0012765 | A1* | 1/2011 | Hsieh .................. G11C 27/024 341/143 |
| 2011/0200070 | A1 | 8/2011 | Makinwa et al. |
| 2011/0221504 | A1 | 9/2011 | Thiagarajan et al. |
| 2011/0298644 | A1* | 12/2011 | Ohba ..................... H03F 3/005 341/155 |
| 2012/0112948 | A1* | 5/2012 | Le Tual ............... H03M 1/468 341/172 |
| 2012/0274489 | A1 | 11/2012 | Chang et al. |
| 2013/0002469 | A1* | 1/2013 | Kull .................... H03M 1/0682 341/172 |
| 2013/0187803 | A1 | 7/2013 | Kaald |
| 2013/0194034 | A1 | 8/2013 | Giuroiu |
| 2014/0354458 | A1 | 12/2014 | Kakamu |
| 2015/0084798 | A1 | 3/2015 | Nezuka |
| 2015/0194976 | A1* | 7/2015 | Chiang ............... H03M 1/0845 341/118 |
| 2015/0249445 | A1 | 9/2015 | Dong et al. |
| 2015/0288380 | A1 | 10/2015 | Zhao et al. |

FOREIGN PATENT DOCUMENTS

| | | |
|---|---|---|
| CN | 103199806 A | 7/2013 |
| CN | 203350757 U | 12/2013 |
| WO | 2007054209 A1 | 5/2007 |

OTHER PUBLICATIONS

Written Opinion of the International Searching Authority for International Application No. PCT/US15/33135 dated Sep. 14, 2015, 6 pages.
Differential Input Dual 2 MSPS 12 Bit 3 Channel SAR ADC, Analog Devices, p. 17, Norwood, MA.
Kevin R. Hoskins and Derek V. Redmayne, "LTC2400 High Accuracy Differential to Single-ended Converter for ±5V Supplies"; 2 pages.
Written Opinion of the International Searching Authority for International Application No. PCT/US2015/61496 dated Mar. 11, 2016; 7pages.
USPTO Applicant Initiated Interview Summary for U.S. Appl. No. 14/865,999 dated Aug. 15, 2016; 3 pages.
USPTO Notice of Allowability for U.S. Appl. No. 14/865,999 dated Oct. 24, 2017; 8 pages.
Analog Devices, "Differential/Single-Ended Input, Dual 2 MSPS, 12-Bit, 3-Channel SAR ADC", www.analog.com, Rev. B, AD7266, 28 pages.
International Search Report for International Application No. PCT/US15/61496 dated Mar. 11, 2016; 2 pages.
Kevin R. Hoskins and Derek V. Redmayne, "LTC2400 High Accuracy Differential to Single-ended Converter to ±5V Supplies"; 2 pages.
Texas Instruments, "Four Output Clock Generator/Jitter Cleaner With Integrated Dual VCOs", Feb. 1, 2012; 48 pages.
USPTO Advisory Action for U.S. Appl. No. 14/865,999 dated May 8, 2017; 2 pages.
USPTO Advisory Action for U.S. Appl. No. 14/865,999 dated Nov. 15, 2016; 3 pages.
USPTO Final Rejection for U.S. Appl. No. 14/865,999 dated Mar. 24, 2017; 21 pages.
USPTO Final Rejection for U.S. Appl. No. 14/865,999 dated Aug. 30, 2016; 20 pages.
USPTO Non-Final Rejection for U.S. Appl. No. 14/865,999 dated Jun. 24, 2016; 17 pages.
USPTO Non-Final Rejection for U.S. Appl. No. 14/865,999 dated Dec. 13, 2016; 20 pages.
USPTO Notice of Allowance for U.S. Appl. No. 14/865,999 dated Jul. 6, 2017; 21 pages.
Written Opinion of the International Searching Authority for International Application No. PCT/US2015/61496 dated Mar. 11, 2016; 7 pages.
SIPO Office Action for International Application No. 201580015710.4 dated Mar. 19, 2018; 10 pages.

\* cited by examiner

PROGRAMMABLE SWITCHED CAPACITOR BLOCK

RELATED APPLICATIONS

This application claims the benefit of U.S. Provisional Application No. 62/005,532 filed on May 30, 2014, the entire contents of which are incorporated by reference.

TECHNICAL FIELD

The present disclosure relates generally to processing devices and particularly to processing devices having a programmable switched capacitor block.

BACKGROUND

Processing devices, such as microcontrollers, may have embedded processors, memories, and special function analog circuits. Typical analog circuits found in microcontrollers include Continuous Time (CT) amplifiers having preset functions with given functional parameters. For instance, a CT analog amplifier may be a fixed function circuit, such as a voltage amplifier, in which certain parameters, such as gain or bandwidth may be changed or altered.

Switched Capacitor (SC) analog circuits are also frequently incorporated into microcontroller designs. A SC analog circuit may be more versatile than CT analog circuits in that it may be possible to alter certain circuit functions as well as the parameters of the circuit function. However, both CT and SC analog circuits found in current microcontrollers cannot generally be dynamically programmed (e.g., programmed "on-the-fly").

Several other design considerations related to microcontroller utilization either go unaddressed, or require separate functionalities to enable them. For instance, existing designs do not offer a programmable analog circuit that may be used to implement various functions on the same semiconductor chip. As a result, realization of an analog function may require fixed functional analog blocks. If a microcontroller design is to include multiple analog functions, then each of the analog functions may require a separate fixed functional analog circuit requiring additional space on the semiconductor chip and additional complexity with regard to the semiconductor chip design. Further, existing microcontroller realizations generally require pre-programming and cannot be dynamically programmed.

BRIEF DESCRIPTION OF THE DRAWINGS

The present disclosure is illustrated by way of example, and not of limitation, in the figures of the accompanying drawings in which.

DETAILED DESCRIPTION

Figure 1:
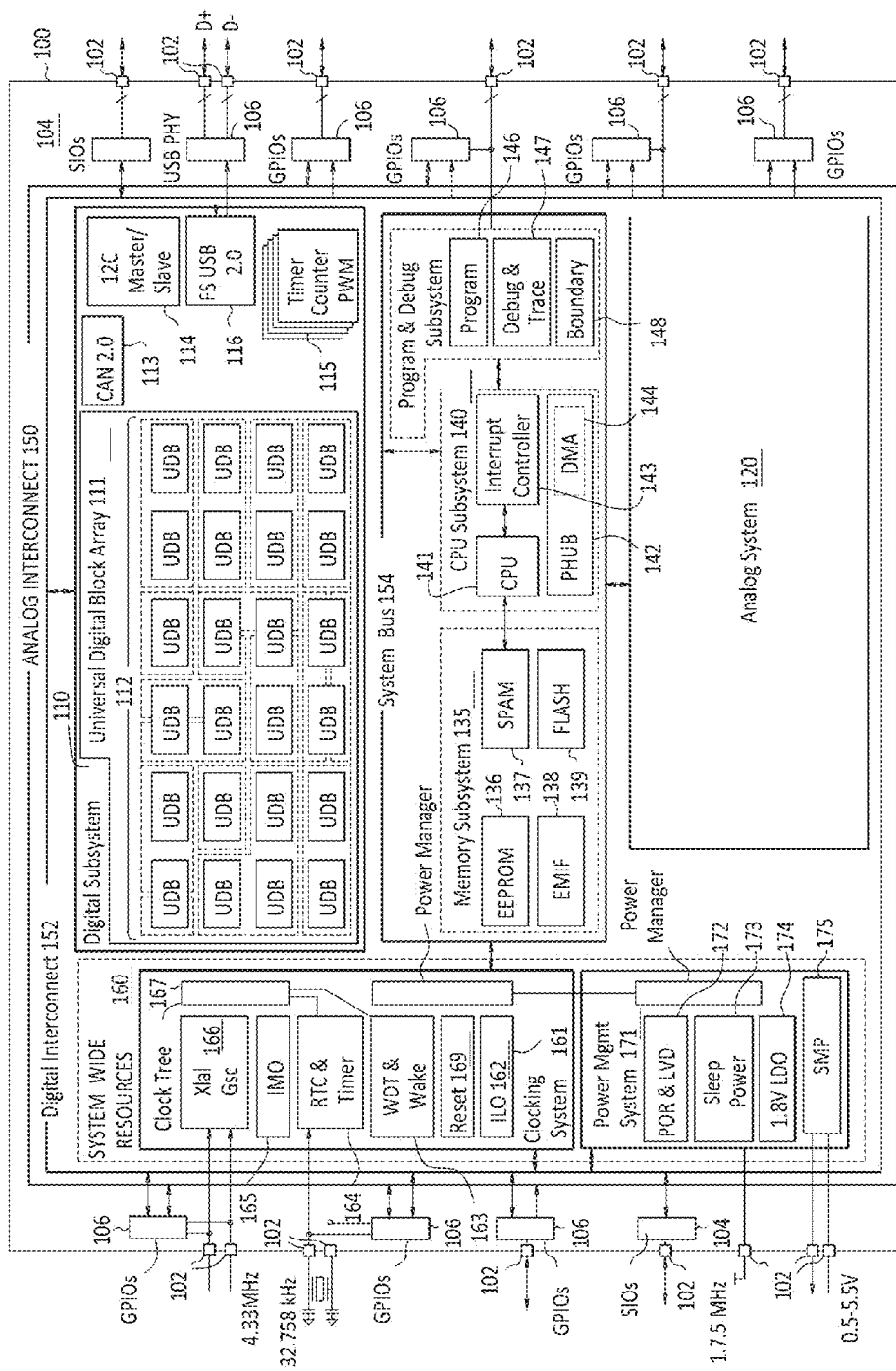
FIG. 1 illustrates an embodiment of a core architecture of a processing device.

Aspects of the present disclosure are directed to a programmable switched capacitor block. A processing device may include the programmable switched capacitor block. For example, a system on a chip (SoC) may include the programmable switched capacitor block to implement multiple analog functions. The programmable switched capacitor block may be configured or programmed to implement a first analog function at a first time and the programmable switched capacitor block may be configured or programmed to implement a second analog function at a second time. Accordingly, the same programmable switched capacitor block may be used to implement various analog functions.

The programmable switched capacitor block may include multiple switched capacitors. A switched capacitor may refer to an electronic circuit component that uses one or more switches to move charge into and out of capacitors as one or more of the switches are open and closed. A switch may refer to an electronic circuit component that can either be in an opened state (i.e., the switch is non-conducting) or in a closed state (i.e., the switch is conducting). The programmable switched capacitor block may include multiple branches that each include multiple switched capacitors. Furthermore, the programmable switched capacitor block may include additional circuit components (e.g., operational amplifiers, comparators, buffers, etc.) that may receive the charge from the capacitors in the switched capacitors from the branches of the programmable switched capacitor block to implement a particular analog function and to provide an analog output signal. For example, specific switches of the programmable switched capacitor block may be configured (e.g., opened or closed) in order to implement a desired analog function and to output a corresponding analog signal. Accordingly, switches of the programmable switched capacitor block may be opened or closed to implement the desired analog function.

In some embodiments, the programmable switched capacitor block may include two portions, or half blocks, where each half block may be used to implement a different analog function and to output a single ended signal. Alternatively, both half blocks of the same programmable switched capacitor block may be used to implement one analog function and to output a differential signal. A differential signal may refer to a signal that is based on two complementary signals transmitted over two separate wires and a single ended signal may refer to a signal that is transmitted over a wire that represents the signal while another wire is connected to a reference voltage (e.g., ground). Each half block of the programmable switched capacitor block may be configured to implement a separate analog function and to provide or output a separate single ended signal. Alternatively, the programmable switched capacitor block may be configured to provide a differential signal based on the use of both half blocks. Accordingly, the programmable switched capacitor block may configured or programmed to operate in a single ended mode where each half portion of the programmable switched capacitor block may output an independent single ended signal. Additionally, the programmable switched capacitor block may be configured or programmed to operate in a differential mode where each half block of the programmable switched capacitor block is used to output the complementary signals of a differential signal.

Thus, since the programmable switched capacitor block may be used to provide multiple analog functions as well as single ended and differential signals, a SoC or other such processing device may use the programmable switched capacitor block to implement analog functionality when needed as opposed to requiring multiple fixed functional analog blocks to provide each analog function to be included in the SoC or a processing device.

Reference in the description to "one embodiment," "an embodiment," or "some embodiments" means that a particular feature, structure, or characteristic described in connection with the embodiment is included in at least one embodiment of the disclosure. The phrase "in one embodiment" or "in some embodiments" located in various places in this description does not necessarily refer to the same embodiment.

FIG. 1 illustrates an embodiment of a core architecture of a processing device 100. In one embodiment, the processing device 100 is a core architecture of the Programmable System-on-Chip (PSoC®) device, such as that used in the PSoC® family of products offered by Cypress Semiconductor Corporation (San Jose, Calif.). In one embodiment, the processing device 100 has the PSoC® 3 or PSoC® 5 core architecture, each developed by Cypress Semiconductor Corporation. In one embodiment, the core architecture includes a digital subsystem 110. The digital subsystem 110 includes a universal digital block array 111, including multiple universal digital blocks (UDBs) 112, a CAN 2.0 interface controller (CAN 2.0) 113, an I2C Master and Slave controller (I2C M/S) 114, multiple multifunction digital blocks (MDBs) 115 and a full-speed USB 2.0 interface controller (FSUSB 2.0) 116. MDBs 115 may be configured to perform common digital functions such as timers, counters and pulse-width modulators (PWMs). Digital subsystem 110 may also include communication peripherals such as Ethernet, high-speed USB, USB host, PCI Express, IEE1394 serial bus interface, SD card reader and others (not shown) The elements of digital system 110 may be coupled to digital interconnect 152 and/or to the system bus 154.

The core architecture may also include an analog subsystem 120. The analog subsystem may include may be a programmable switched capacitor block or may include a programmable switched capacitor block.

The core architecture 100 may also include memory subsystem 135, CPU subsystem 140 and programming and debug subsystem 145. Memory subsystem 135 may include an EEPROM block 136, synchronous random access memory (SRAM) 137, an external memory interface (EMIF) block 138, and flash memory (FLASH) 139. Memory subsystem 135 may also include a memory cache or memory accelerator (not shown). CPU subsystem 140 may include a CPU 141, an interrupt controller 142 and a bus bridge controller (DMA/PHUB) 143, which may include a direct memory access (DMA) controller 144. The program and debug subsystem 145 may include a programming block 146, and debug and trace block 147 and a boundary scan block 148. The program and debug subsystem may be coupled to the CPU subsystem. The CPU subsystem and the memory system may be coupled to system bus 154. The memory subsystem 135 may be coupled to the CPU subsystem 140 through the system bus 154. In one embodiment, FLASH 139 may be coupled to the CPU 141 directly.

The core architecture 100 may also include system-wide resources 160. System-wide resources may include a clocking subsystem 161 and power management subsystem 171. Clocking subsystem 161 may include an internal low-speed oscillator block (ILO) 162, a watch-dog timer (WDT) and wake-up controller block 163, a real-time clock (RTC)/timer block 164, an internal main oscillator block (IMO) 165, a crystal oscillator block (Xtal Osc) 166, a clock tree 167, power manager 168 and reset block 169. In one embodiment the RTC/timer block 164 and the ILO 162 may be coupled to the WDT and wake-up controller block 163. In another embodiment, clock tree 167 may be coupled to Xtal Osc block 166 and IMO 165. Power management system 171 may include power-on-reset (POR) and low-voltage-detect (LVD) block 172, a sleep power block 173, a 1.8V internal regulator (LDO) 174, a switched mode power supply (e.g., switch-mode pump, SMP) 175 and power manager 178. The switched mode power supply may implement a boost circuit, a bust circuit or both. Power manager 178 may be coupled to power manager 168 of the clocking subsystem 161. In one embodiment, system-wide resources 160 may be coupled to system bus 154.

The core architecture 100 may also include multiple pins 102. Pins 102 may be used to connect elements of core architecture 100 to off-chip elements or route signals into, out of on-chip elements or to different pins of the device. Core architecture 100 may also include multiple special input/outputs (SIOs) 104 and GPIOs 106. SIOs 104 may be coupled to digital interconnect 152. GPIOs 106 may be coupled to analog interconnect 150, digital interconnect 152, RTC/timer block 164, and/or Xtal Osc block 166. Core architecture may also include USB input/outputs (USB PHY) 108, which may be coupled to FSUSB 2.0 116.

Figure 2:
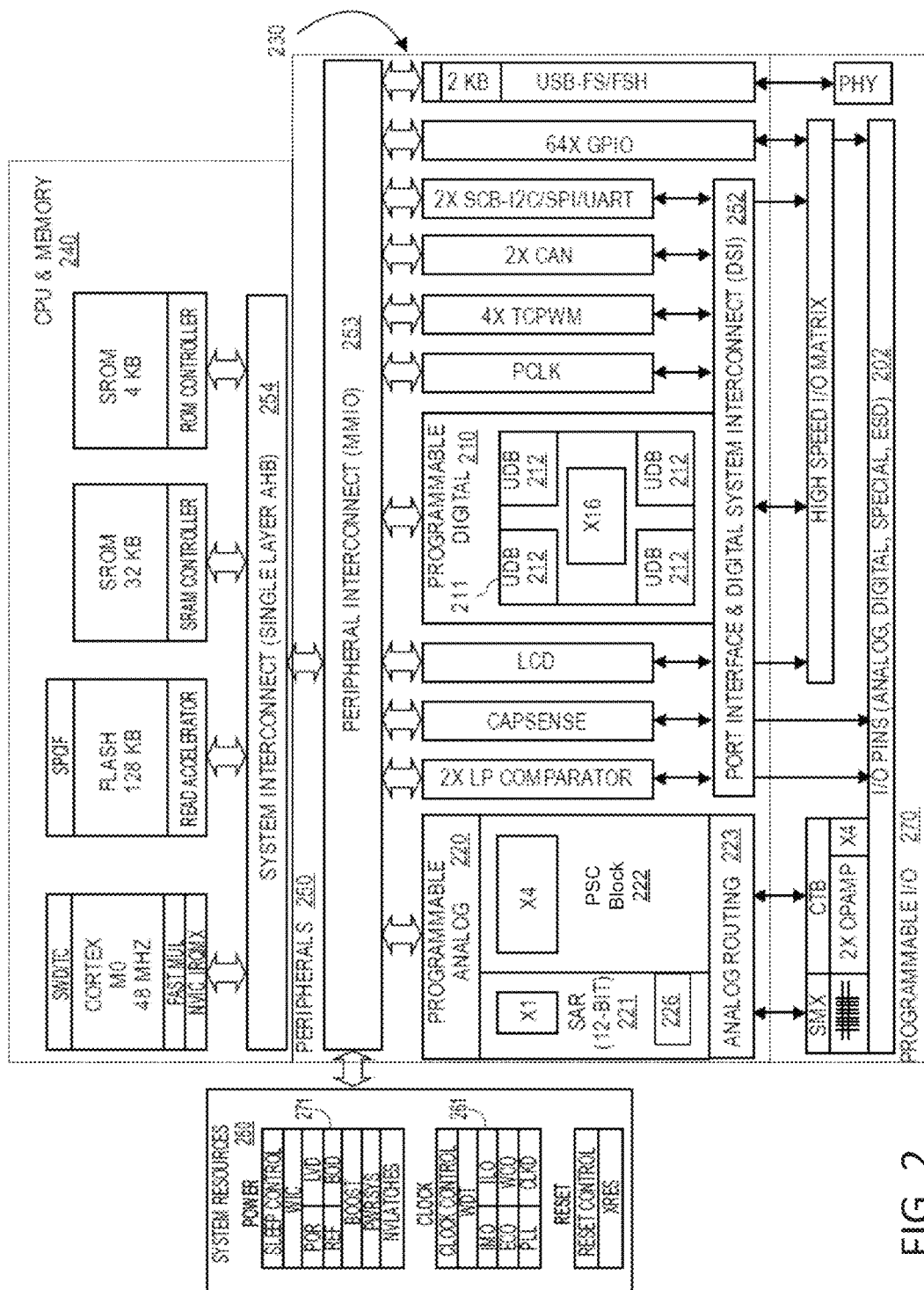
FIG. 2 illustrates another embodiment of a core architecture of a processing device with a programmable switched capacitor block.

FIG. 2 illustrates another embodiment of a core architecture of a processing device 200 with a programmable switched capacitor (PSC) block. In one embodiment, the processing device 200 has the PSoC® 4 core architecture, developed by Cypress Semiconductor Corporation. In the depicted embodiment, the processing device 200 includes a CPU and memory subsystem 240, peripherals 250, system resource 260, and programmable I/O 270. The peripherals 250 include a peripheral interconnect (MMIO) 253), programmable digital subsystem 210, programmable analog subsystem 220, a port interface and digital system interconnect (DSI) 252), and various other components 230, such as comparators, capacitive sensing blocks, LCD direct drive blocks, a CAN interface controller, an I2C M/S, MDBs, and a FSUSB 2.0, as described herein. The MDBs may be configured to perform common digital functions such as timers, counters and pulse-width modulators (PWMs). The various other components may be communication peripherals such as Ethernet, high-speed USB, USB host, PCI Express, IEE1394 serial bus interface, SD card reader and others. The programmable digital subsystem 210 and some of the other components 230 are coupled to the port interface and digital subsystem interconnect (DSI) 252. The programmable digital subsystem 210, the programmable analog subsystem 220 and the other components 230 are coupled to the peripheral interconnect (MMIO) 253. The programmable analog subsystem 220 and some of the other components 230 are coupled to the programmable I/O 270.

The digital subsystem 210 includes a universal digital block array 211, including multiple UDBs 212. The digital subsystem 210 may also include other interface controller, multifunction digital blocks, communication peripherals, or the like. The elements of digital system 210 may be coupled to digital interconnect 252 and/or to a peripheral interconnection (MMIO) 253, which is coupled to the system interconnect 254 of a CPU and memory subsystem 240. The CPU and memory subsystem 240 may include FLASH, SRAM, SROM blocks and a CPU, each coupled to the system interconnect 254. The CPU and memory subsystem 240 may include other components as would be appreciated by one of ordinary skill in the art having the benefit of this disclosure.

The core architecture 200 may also include an analog subsystem 220. The analog subsystem 220 may include successive approximation registers (SARs) ADC block 221, programmable switched capacitor block 222, and analog routing 223. In another embodiment, the programmable switched capacitor block 222 is implemented in one or more other components of the programmable analog subsystem 220 or the processing device 200. In another embodiment, the programmable switched capacitor block 222 can be implemented in other locations as would be appreciated by one of ordinary skill in the art having the benefit of the disclosure. Details regarding the programmable switched capacitor block are described below with respect to FIGS. 3-8.

The core architecture of the processing device 200 may also include system-wide resources 260. System-wide resources 260 may include a clocking subsystem 261 and power management subsystem 271. Clocking subsystem 261 may include various components as described herein, such as ILO, WDT, clock control, IMO, ECO, PLL, CLKD, WCO, or the like. Power management system 171 may include various components as described herein, such as sleep control, WIC, POR, LVD, REF, BOD, Boost, PWR-SYS, NV latches, or the like. In one embodiment, system-wide resources 260 may be coupled to peripheral interconnect 253.

The core architecture 200 may also include multiple pins 202. Pins 202 may be used to connect elements of core architecture 200 to off-chip elements or route signals into, out of on-chip elements or to different pins of the device. Core architecture 200 may also include multiple SIOs and GPIOs. The programmable I/O 270 also may include a high-speed I/O matrix, a physical interface (PHY), Successive Approximation Register multiplexer (SARMUX) (also labeled as SMX), Continuous Time Block (CTB), and the like. For example, a CTB may include two operational amplifiers, a programmable resister string, and part of the analog routing interconnection, including connections to the pins. Core architecture 200 may also include USB input/outputs (USB PHY) 108, which may be coupled to FSUSB 2.0 116.

In the embodiment of FIG. 2, the processing device 200 is described in the context of the PSoC® 4 processing device. In other embodiments, the processing device may be may be one or more other processing devices known by those of ordinary skill in the art, such as a microprocessor or central processing unit, a controller, a special-purpose processor, digital signal processor ("DSP"), an application specific integrated circuit ("ASIC"), a field programmable gate array ("FPGA"), or the like.

Figure 3:
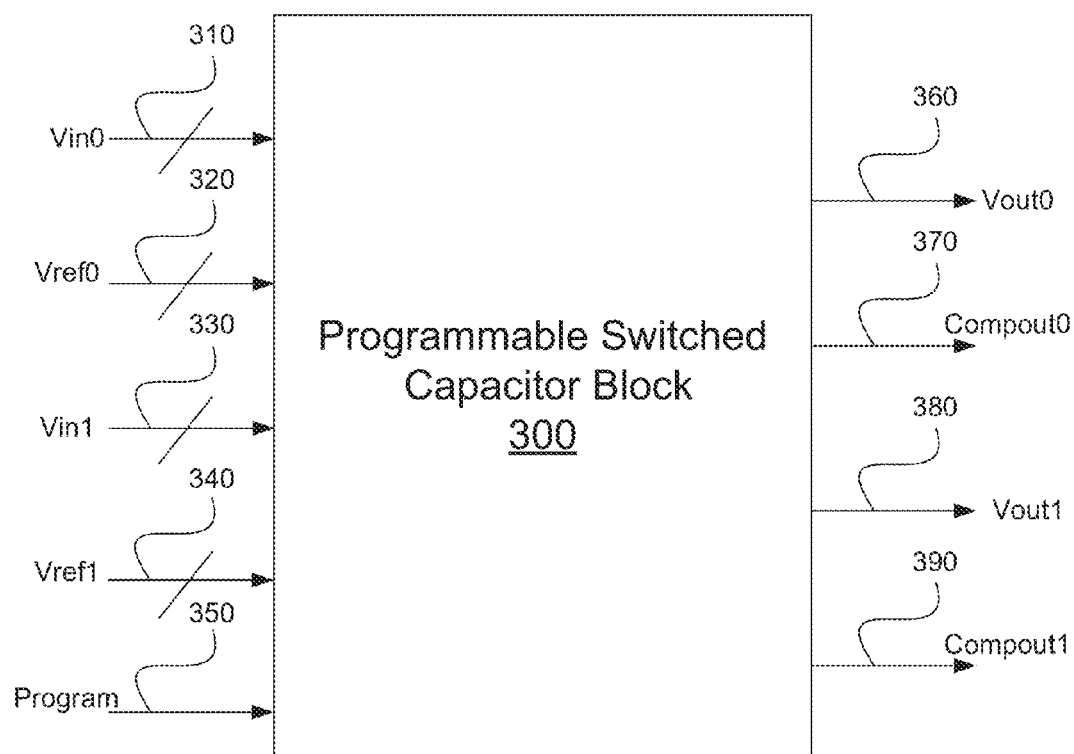
FIG. 3 is a block diagram of an example programmable switched capacitor block in accordance with some embodiments of the present disclosure.

FIG. 3 is a block diagram of an example programmable switched capacitor block 300. In general, the programmable switched capacitor block 300 may receive input signals and a programming signal to implement an analog function and output one or more signals. The programmable switched capacitor block 300 may correspond to the programmable switched capacitor block 222 of FIG. 2.

As shown in FIG. 3, the programmable switched capacitor block 300 may receive multiple input signals. For example, the programmable switched capacitor block 300 may receive input voltage signals 310 for a first half block of the programmable switched capacitor block 300 and second input voltage signals 340 for a second half block of the programmable switched capacitor block 300. In some embodiments, each of the input voltage signals 310 and the input voltage signals 330 may be a group of voltage input signals. For example, the input voltage signals 310 may include four voltage input signals (e.g., $V_{in00}$, $V_{in01}$, $V_{in02}$, and $V_{in03}$) and the input voltage signals 340 may also include four input voltage signals (e.g., $V_{in10}$, $V_{in11}$, $V_{in12}$, and $V_{in13}$). Accordingly, the programmable switched capacitor block 300 may receive two sets or groups of input voltage signals.

Furthermore, the programmable switched capacitor block 300 may receive first voltage reference signals 320 and second voltage reference signals 340. For example, the first voltage reference signals 320 may be a group of voltage reference signals for a first half block of the programmable switched capacitor block 300 and the second voltage reference signals 340 may be a group of voltage reference signals for a second half block of the programmable switched capacitor block 300. In some embodiments, the first voltage reference signals 320 may include a first and second voltage reference signal (e.g., $V_{ref00}$ and $V_{ref\ 01}$) and the second voltage reference signals 340 may include another first and second voltage reference signal (e.g., $V_{ref10}$ and $V_{ref\ 11}$). In the same or alternative embodiments, one of the voltage reference signals may correspond to a ground reference signal. Additionally, the programmable switched capacitor block 300 may receive a programming signal 350. In some embodiments, the programming signal 350 may specify an analog function that is based on either single ended signaling or differential signaling. As discussed in further detail below, the programmable switched capacitor block 300 may configure one or more switches (e.g., open or close the switches) based on the analog function and the type of signaling (e.g., single ended or differential) that is identified from the programming signal 350.

Referring to FIG. 3, the programmable switched capacitor block 300 may transmit a first voltage output signal 360, a first comparator output signal 370, a second voltage output signal 380, and a second comparator output signal 390. A first half block of the programmable switched capacitor block 300 may generate the first voltage output signal 360 and the first comparator output signal 370 and a second half block of the programmable switched capacitor block 300 may generate the second voltage output signal 380 and the second comparator output signal 390. Further details with regard to each of the first half block and the second half block of the programmable switched capacitor block 300 are disclosed with regard to FIGS. 4-8.

Figure 4:
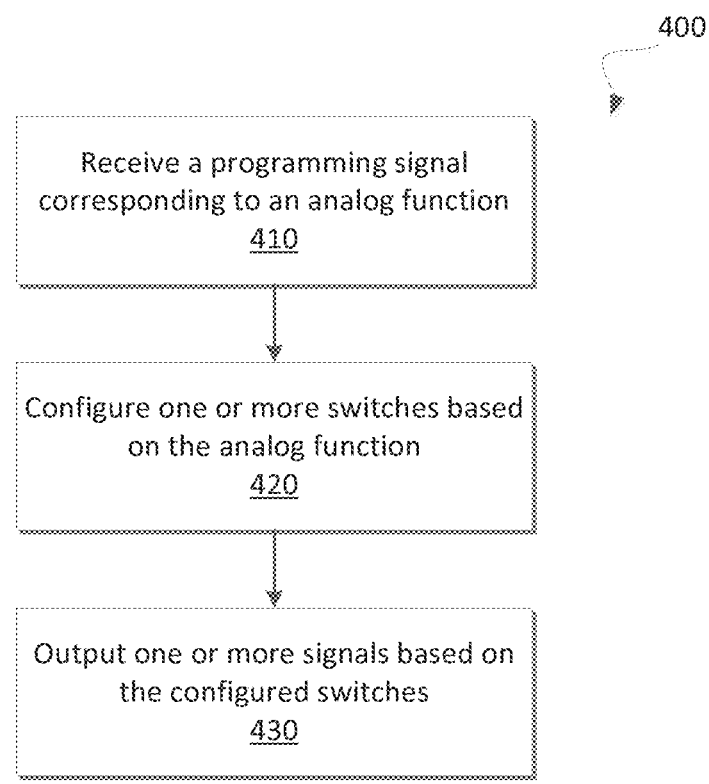
FIG. 4 is a flow diagram of an example method to configure a programmable switched capacitor block based on an analog function in accordance with some embodiments.

FIG. 4 is a flow diagram of an example method 400 to configure a programmable switched capacitor block based on an analog function. The method 400 may be performed by processing logic that may include hardware (circuitry, dedicated logic, etc.), software (such as is run on a computing system or a dedicated machine), firmware (embedded software), or any combination thereof. In general, the programmable switched capacitor blocks 222 and 300 of FIGS. 2 and 3 may perform the method 400.

As shown in FIG. 4, the method 400 may begin with the processing logic receiving a programming signal (e.g., program signal 350) corresponding to an analog function (block 410). In some embodiments, the programming signal may specify that a programmable switched capacitor block that receives the programming signal is to be configured or programmed to implement the requested analog function and to output either a single ended signal or a differential signal. In the same or alternative embodiments, the programming signal may be received from a microcontroller on a processing device that includes the programmable switched capacitor block. The processing logic may configure one or more switches based on the analog function (block 420). For example, the processing logic may configure one or more switches of a programmable switched capacitor block so that the programmable switched capacitor block may provide or implement the analog function. In some embodiments, a switch may correspond to an electrical circuit component that includes two conductive pieces, referred to as contacts, that may be connected to a portion of a circuit. The contacts of the switch may touch to complete a circuit (i.e., a closed state) or the contacts of the switch may be separated to break a circuit (i.e., an open state). Accordingly, the configuring of a switch based on the analog function may determine whether a particular switch is to be in an open state or a closed state (and how long the switch is to be in either state).

Referring to FIG. 4, the processing logic may output one or more signals based on the configured switches (block 430). For example, an analog function may be implemented by the configuring of the switches and an output signal corresponding to the analog function may be provided. In some embodiments, the output signal may be based on either single ended signaling or differential signaling based on the requested analog function.

Figure 5:
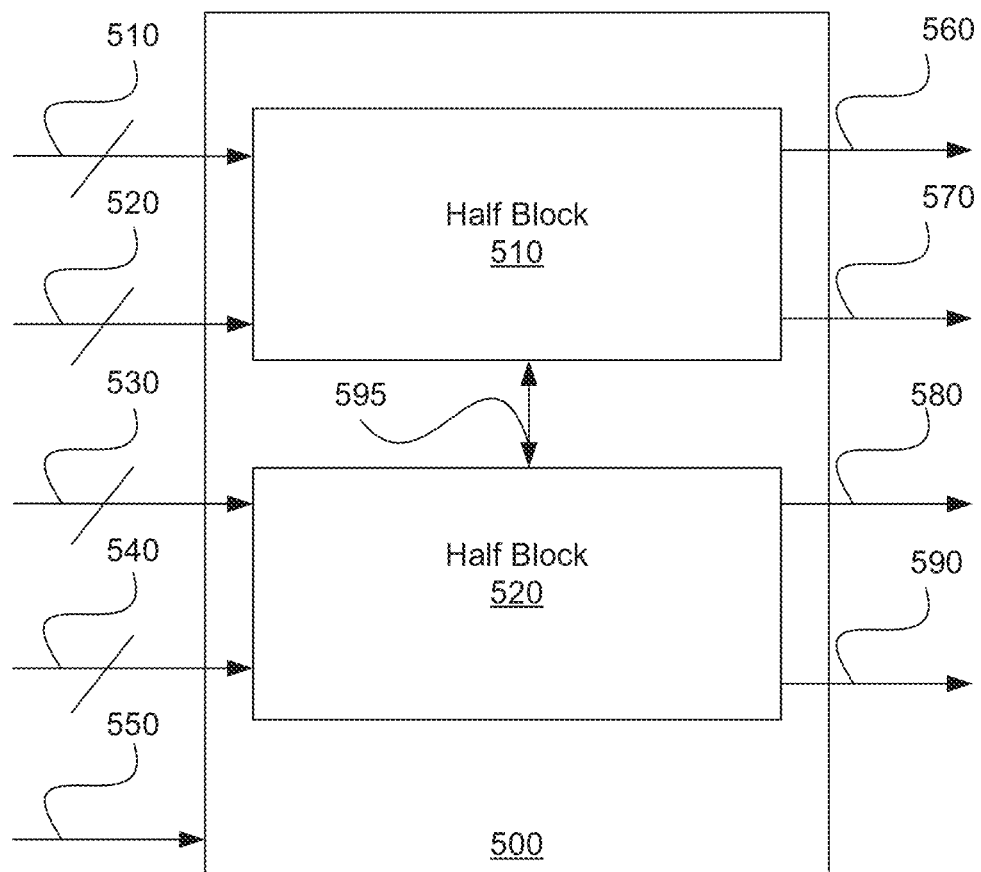
FIG. 5 is a block diagram of two half blocks of an example programmable switched capacitor block in accordance with some embodiments of the present disclosure.

FIG. 5 is a block diagram of two half blocks of an example programmable switched capacitor block 500. In general, the programmable switched capacitor block 500 may include a first half block 510 and a second half block 520 where each half block is capable of either transmitting a single ended signal or both the first half block 510 and the second half block 520 may be used to transmit a differential signal. The programmable switched capacitor block 500 may correspond to the programmable switched capacitor blocks 222 or 300 of FIGS. 2 and 3.

As shown in FIG. 5, the programmable switched capacitor block 500 includes a first half block 510 and a second half block 520. In some embodiments, each of the first half block 510 and the second half block 520 may include multiple switched capacitors, at least one operational amplifier, and at least one comparator. The first half block 510 may receive a first voltage input signals 510 and first voltage reference signals 520 and may generate the first voltage output signal 560 and the first comparator output signal 570 based on the first voltage input signals 510 and the first voltage reference signals 520. Furthermore, the second half block 520 may receive the second voltage input signals 530 and the second voltage reference signals 540 and may generate the second voltage output signal 580 and the second comparator output signal 590 based on the second voltage input signals 530 and the second voltage reference signals 540. Furthermore, the programmable switched capacitor block may receive a programming signal 550 that may be used to determine which switches to configure (e.g., open and/or close) for both the first half block 510 and the second half block 520. Additionally, a signal or wire 595 may couple or connect the first half block 510 to the second half block 520. In some embodiments, a switch in either the first half block 510 or the second half block 520 may be configured to connect or not to connect the first half block 510 to the second half block 520 based on a requested analog function to be implemented by the programmable switched capacitor block 500. Further details with regard to the switches, capacitors, operational amplifiers, comparators, and buffers of each of the first half block 510 and the second half block 520 are described in further detail with regard to FIGS. 6-8.

Figure 6:
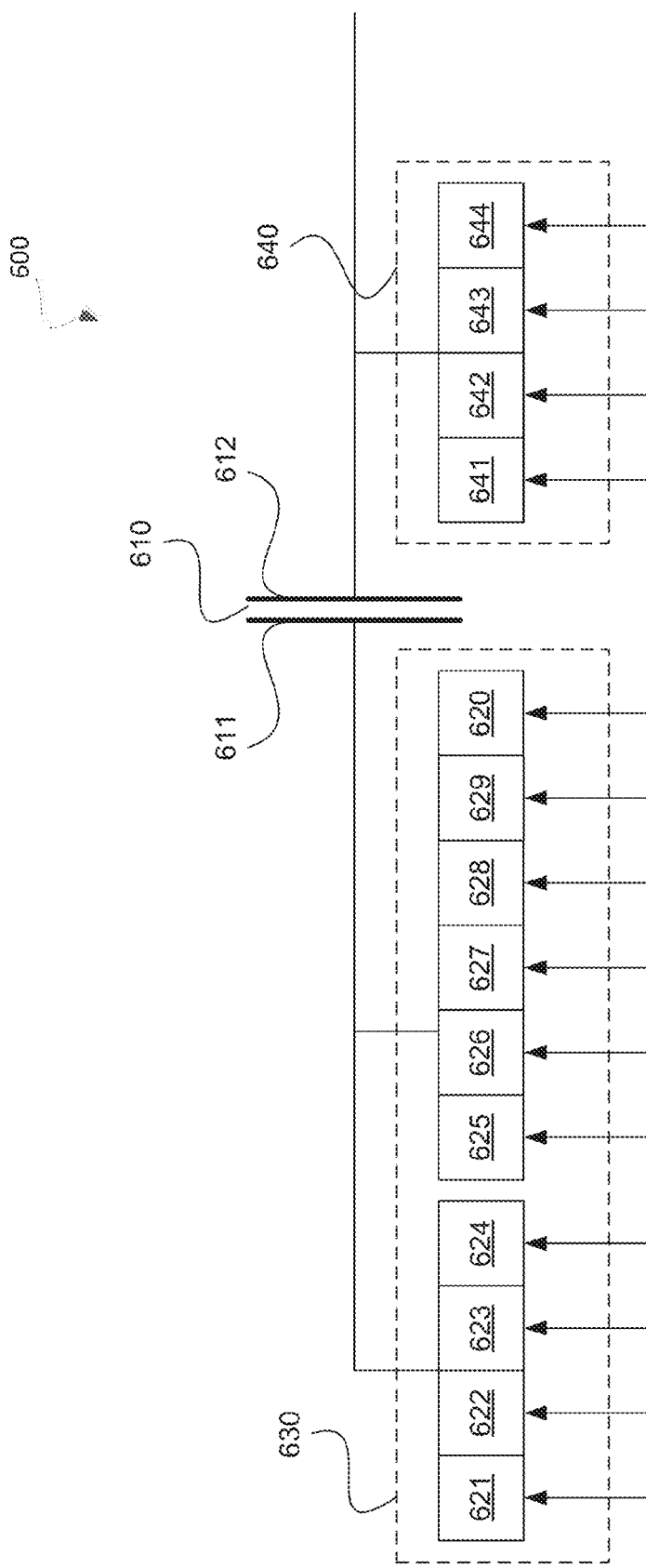
FIG. 6 is an illustration of an example switched capacitor used in the programmable switched capacitor block in accordance with some embodiments.

FIG. 6 is an illustration of an example switched capacitor 600 used in a programmable switched capacitor block. In general, the switched capacitor 600 may include a capacitor 610 and various switches that may either be opened or closed based on a requested analog function received by the programmable switched capacitor block. In some embodiments, the switched capacitor 600 may be included in the programmable switched capacitor blocks 222, 300, and 500 of FIGS. 2, 3, and 5.

As shown in FIG. 6, the switched capacitor 600 may include a capacitor 610 that includes a left side capacitor plate 611 and a right side capacitor plate 612. In some embodiments, the switched capacitor may refer to an electronic circuit element that may be used for discrete time signal processing and may be partly used to provide an analog function. The switched capacitor 600 may be used to move charge into the capacitor 610 as well as to move charge out of the capacitor 610 based on when a corresponding switch is opened and closed. In some embodiments, the switched capacitor used in a programmable switched capacitor block may include a first switch bank 630 and a second switch bank 640. The first switch bank 630 may be coupled to the left side capacitor plate 611 and the second switch bank 640 may be coupled to the right side capacitor plate 612. Furthermore, each of the first switch bank 630 and the second switch bank 640 may include multiple switches where one or more switches from each bank may be opened or closed based on an analog function that is to be implemented. For example, the first switch bank 630 may include multiple switches 620-629. In some embodiments, the switches 621-624 may correspond to input voltage signals (e.g., $V_{in00}$, $V_{in01}$, $V_{in02}$, and $V_{in03}$). The switch 625 may correspond to a $V_{out0}$ signal that may be the output of a half block of the programmable switched capacitor block that includes the switched capacitor 600. Furthermore, the first switch bank 630 may include a $V_{out1}$ signal that may correspond to a signal that may be the output of the other half block that is included in the programmable switched capacitor block. Accordingly, a switch in the first switch bank 630 may be used to connect or couple a signal from the output of a first half block to the left side capacitor plate 611 and another switch in the same first switch bank 630 may be used to connect or couple from the output of a second half block to the same left side capacitor plate 611. Furthermore, the first switch bank 630 may include a signal that corresponds to a common signal between a corresponding switched capacitor in the other half block of the programmable switched capacitor (e.g., a ComA or common A signal). The switch 628 may correspond to a $V_{ss}$ signal that may refer to a voltage source, the switch 629 may correspond to a voltage reference signal (e.g., $ref_0$), and the switch 620 may correspond another voltage reference signal (e.g., $agnd_0$ which may correspond to electrical ground).

The second switch bank 640 may be coupled to the right side capacitor plate 612. Furthermore, the second switch bank 640 may include a switch 641 corresponding to a voltage reference signal (e.g., $ref_1$), the switch 642 may correspond to electrical ground, the switch 643 may correspond to another voltage reference signal (e.g., $ref_0$), and the switch 644 may correspond to a voltage source. In some embodiments, the voltage signal ref1 may be from a buffer of a first half block that includes the switched capacitor 600 and the additional voltage reference signal may be from a buffer of a second half block that does not include the switched capacitor 600.

In operation, one or more of the switches from the first switch bank 630 may be opened and closed based on an analog function that a programmable switched capacitor block is to implement. The closing of the switch may result in charge being moved into the capacitor 610. Furthermore, in some embodiments, one or more of the switches from the second switch bank 640 may be used to transfer or move the charge from the capacitor 610 to a negative terminal of an operational amplifier (opamp).

In some embodiments, the various switches may include, but are not limited to, complementary metal-oxide-semiconductor (CMOS) switches, pumped switches, and a t-switch. Accordingly, in some embodiments, the switch banks 630 and 640 may each include one or more different types of switches. For example, a type of switch may be used based on the signal that the switch corresponds to. For example, a CMOS switch or a T-switch may be used for a signal that requires a rail to rail transition (e.g., a sine wave based signal that goes from an upper range to a lower range) and the pumped switch may be used for a signal that corresponds to ground or 0 volts.

As will be described in further detail with regard to FIG. 7, a programmable switched capacitor block may include two half blocks, each of which includes multiple capacitor branches. Each of the capacitor branches may include multiple programmable switched capacitors. As an example, each half block of the programmable switched capacitor block may include three capacitor branches and each of the capacitor branches may include six switched capacitors.

Figure 7A:
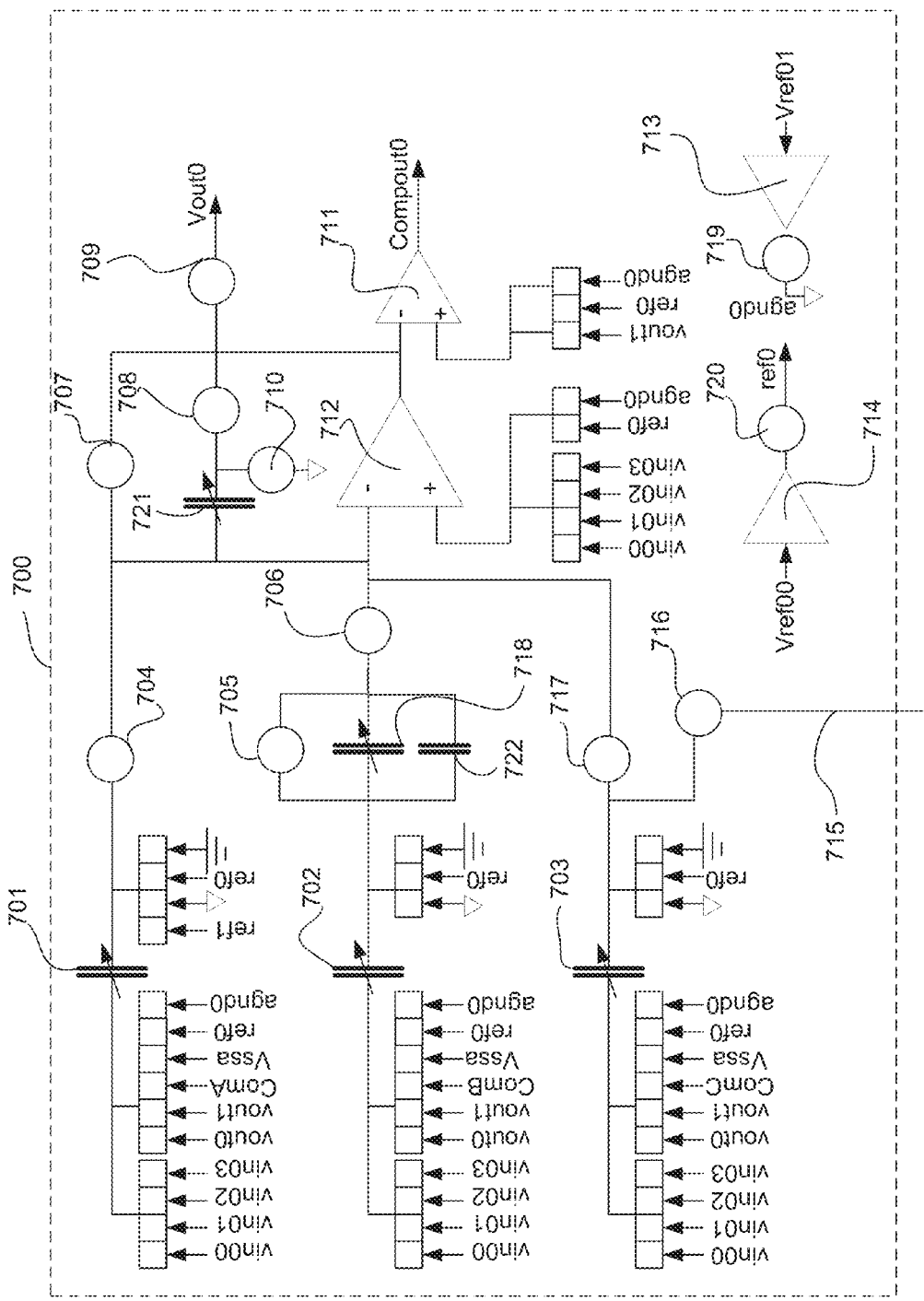
FIG. 7A is a block diagram of an example half block of a programmable switched capacitor block in accordance with some embodiments of the present disclosure.

FIG. 7A is a block diagram of an example half block 700 of a programmable switched capacitor block. In general, the programmable switched capacitor block 700 may include two half block that each include three capacitor branches. The half block 700 may correspond to one of the half blocks 510 or 520 of FIG. 5.

As shown in FIG. 7A, the half block 700 may include multiple switched capacitors (e.g., as described with regard to FIG. 6). For example, the half block 700 may include three capacitor branches where each capacitor branch includes multiple switched capacitors. For example, capacitors 701 may be part of a first capacitor branch (e.g., Branch A), the capacitors 702 may be part of a second capacitor branch (e.g., Branch B), and the capacitors 703 may be part of a third capacitor branch (e.g., Branch C). As shown, each of the switched capacitors in each of the capacitor branches includes a first switch bank and a second switch bank as previously described. In some embodiments, the inputs to each switch of the switch banks may be similar for each of the capacitor branches, but one signal in the first switch bank may differ between the capacitor branches of a half block. For example, as shown, the first branch is associated with a signal "ComA" (also referred to as a Common A signal), the second branch is associated with a signal "ComB," and the third capacitor branch is associated with a signal "ComC." In some embodiments, each of the ComA, ComB, and ComC signals may be a same signal as an input signal to another first switch bank of a corresponding capacitor branch in the other half block of the programmable switched capacitor block. For example, a first capacitor branch of a first half block may have one switch in its first switch bank that includes an input to a switch that is coupled to the ComA signal and the first capacitor branch of the second half block may also have one switch in its first switch bank that also includes an input to a switch that is coupled to the same ComA signal. Accordingly, one of the signals in each first switch bank of a first half block may be the same signal as one of the signals in a corresponding first switch bank of the second half block.

Referring to FIG. 7A, the half block 700 may further include multiple switches. For example, the half block 700 may include switches 704, 705, 706, 707, 708, 709, 710, 716, 717, 718, 719, and 720. Each of the switches may be opened and/or closed based on an analog function that is to be implemented, a number of bits that are to be output, and/or whether the analog function that is to be implemented is based on single ended signaling or differential signaling. For example, the switches 704, 706, and 717 may be used to transfer a charge from a capacitor in a capacitor branch to the negative terminal of the operational amplifier (op-amp) 712. As an example, if the switch 704 is closed, then the charge from the capacitors 701 may be transferred to the negative terminal of the op-amp 712. Similarly, if the switches 706 and 717 are closed, then the charge from the capacitors 702 and 703 may be moved from the capacitors 702 and the capacitors 703 to the negative terminal of the op-amp 712.

The half block 700 may further include op-amp 712, comparator 711, capacitor 721, and buffers 713 and 714. In some embodiments, the buffers 713 and 714 may be used to buffer an input reference voltage that is used for outputting a single ended signal. The buffer 713 may receive a first reference voltage signal and the buffer 714 may receive a second reference voltage signal. The negative terminal of the op-amp 712 may be coupled to receive charge from any of the capacitors 701, 702, and 703 and the positive terminal of the op-amp 712 may be coupled to additional switches. For example, the positive terminal of the op-amp 712 may be coupled to switches coupled to input voltage signals (e.g., $V_{in00}$, $V_{in01}$, $V_{in02}$, and $V_{in03}$) as well as switches coupled to a first voltage reference signal (e.g., an output from the buffer 714) and a second voltage reference signal (e.g., an output from the buffer 713). Furthermore, the output of the op-amp 712 may be coupled to the negative terminal of the comparator 711 and the positive terminal of the comparator 711 may be coupled to additional switches. For example, the positive terminal of the comparator 711 may be coupled to switches that are associated with the first and second voltage reference signals and the output voltage signal of the second half block. Accordingly, the negative terminal of the comparator 711 may receive the output voltage signal of the first half block that includes the comparator 711 and the positive terminal of the comparator 711 may receive the output voltage signal of a second half block that does not include the comparator 711 if a particular switch that is coupled to the positive terminal of the comparator 711 is closed.

Referring to FIG. 7A, the capacitor 721 may be referred to as a feedback capacitor that may store charge for the output voltage signal. The switch 710 may be used to discharge the capacitor (e.g., by the closing of the switch). Furthermore, the switches 707 and 708 may both be simultaneously closed to remove the charge from the capacitor 721. Alternatively, the switches 708 and 709 may be simultaneously closed to transfer charge from the capacitor 721 to the output voltage signal. Furthermore, the half block 700 may include an attenuation capacitor 722 and a series capacitor 718. In some embodiments, the first capacitor branch and the second capacitor branch, each of which are associated with six bits, may be combined to implement the functionality of a twelve bit capacitor by the use of the attenuation capacitor 722. Accordingly, if an analog function that is to be implemented requires a twelve bit capacitor, the first capacitor branch and the second capacitor branch of a half block may be combined by the use of an attenuation capacitor 722 that is included in the second capacitor branch. For example, if the attenuation capacitor 722 is not to be used (e.g., bits from a first capacitor branch are not to be combined with bits from a second capacitor branch), then the switch 705 may be closed to remove the effect of the attenuation capacitor 722 and if the attenuation capacitor 722 is to be used (e.g., bits from the first capacitor branch are to be combined with bits from the second capacitor branch), then the switch 705 may be opened so that the effect of the attenuation capacitor 722 is not removed. Accordingly, a switch may be opened if bits from capacitors from different capacitor branches are to be combined and the same switch may be closed if bits from capacitors from different capacitor branches are not to be combined. In some embodiments, the attenuation capacitor may be included in each of the multiple branches of each of the half blocks.

The half block 700 may further include switch 716 so that the third capacitor branch may be used in the other half block of the programmable switched capacitor block that includes the half block 700. For example, if a requested analog function that is to be implemented by the programmable switched capacitor block requires four capacitor branches to implement the analog function, then the switch 716 may be closed to connect the capacitor of a capacitor branch from the second half block to the negative terminal of the op-amp 712 and/or capacitor 721.

As such, a half block of a programmable switched capacitor block may include multiple capacitor branches, an operational amplifier, and a comparator. The capacitor branches may be associated with multiple switches where one switch coupled to the left side capacitor plate of each capacitor may be associated with a signal that is the same as another switched that is coupled to the left side capacitor plate of the other half block of the programmable switched capacitor. Furthermore, the negative terminal of the operational amplifier may receive a charge from the capacitors of one or more capacitor branches and the positive terminal of the operational amplifier may be coupled to multiple switches. The switches coupled to the positive terminal of the operational amplifier may connect a first and/or second reference signal to the positive terminal of the operational amplifier. Furthermore, the negative terminal of the comparator may receive the output of the operational amplifier and the positive terminal of the comparator may be coupled to multiple switches where one of the switches is the output voltage signal of the other half block and at least two of the other switches are used to connect the first and second reference voltage signals to the positive terminal of the comparator.

Figure 7B:
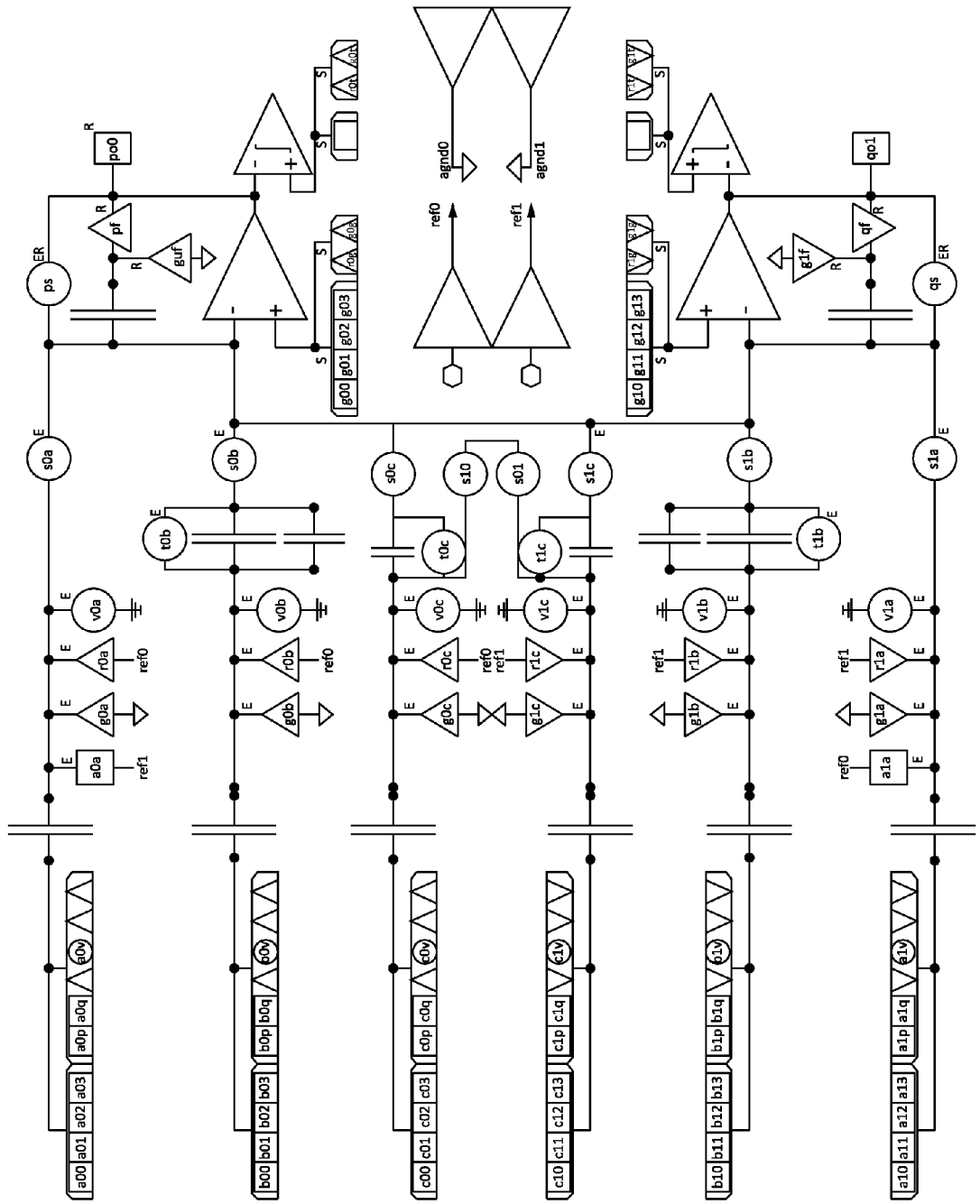
FIG. 7B is a block diagram of an example programmable switched capacitor block in accordance with some embodiments of the present disclosure.

FIG. 7B is a block diagram of an example programmable switched capacitor block 750. In general, the programmable switched capacitor block 750 may include a first half block 730 and a second half block 740 that may each be used to implement a separate analog function based on a single ended signal or may both be used to implement an analog function based on a differential signal. The programmable switched capacitor block may correspond to the programmable switched capacitor blocks 300 or 500 of FIGS. 3 and 5. The first half block 730 may correspond to the half block 700 of FIG. 7A.

As shown in FIG. 7B, the programmable switched capacitor block 750 may include a first half block 730 and a second half block 740. Each of the first half block 730 and the second half block 740 may include similar components or structure. For example, each of the half blocks may include multiple capacitor branches, an operational amplifier, a comparator, buffers, and various switches. The capacitor branches of the first half block may include switches that may be closed to couple a signal from a first group of voltage input signals (e.g., $V_{in00}$, $V_{in01}$, $V_{in02}$, and $V_{in03}$) to a left side capacitor plate and the capacitor branches of the second half block may include switches that may be closed to couple a signal from a second group of voltage signals (e.g., $V_{in10}$, $V_{in11}$, $V_{in12}$, and $V_{in13}$) to a left side capacitor plate. Additionally, the first branch of the first half block 730 and the first branch of the second half block 740 may each include a common signal (e.g., ComA) that may be coupled to the left side capacitor plate if a particular switch is closed. Furthermore, the positive terminal of each operational amplifier may include switches that may couple the same reference voltages to each operational amplifier of the first half block 730 and the second half block 740. For example, the positive terminal of the operational amplifier from the first half block 730 may be coupled to switches that may be used to connect any of the first group of voltage input signals and additional switches to connect the first and second reference voltage signals to the positive terminal of the operational amplifier. Furthermore, the positive terminal of the operational amplifier from the second half block 740 may be coupled to switches that may be used to connect any of the second group of voltage input signals to the positive terminal of the operational amplifier as well as additional switches that may be used to connect the same first and second reference voltage signals to the positive terminal of the operational amplifier. Accordingly, the positive terminal of both operational amplifiers from each of the half blocks may be configured to receive the same voltage reference signal.

Furthermore, as shown, the output voltage of the first half block 730 may be received by the positive terminal of the comparator of the second half block 740 by closing a particular switch and the output voltage of the second half block 740 may be received by the positive terminal of the comparator of the first half block 730 by the closing of another switch.

Referring to FIG. 7B, the programmable switched capacitor block 750 may include two sets of reference buffers (e.g., a first pair of buffers for the first half block 730 and a second pair of buffers for the second half block 740). In some embodiments, each of the pair of reference buffers may receive different input signals so that two dissimilar single ended signals associated with two different analog functions may be implemented by the programmable switched capacitor block 750. For example, the first half block 730 may have a first reference voltage and a first analog ground voltage and the second half block 740 may have a second reference voltage and a second analog ground voltage. Accordingly, the programmable switched capacitor block may support two different analog functions requiring different single ended signals that operate at different reference and ground voltages.

Figure 8:
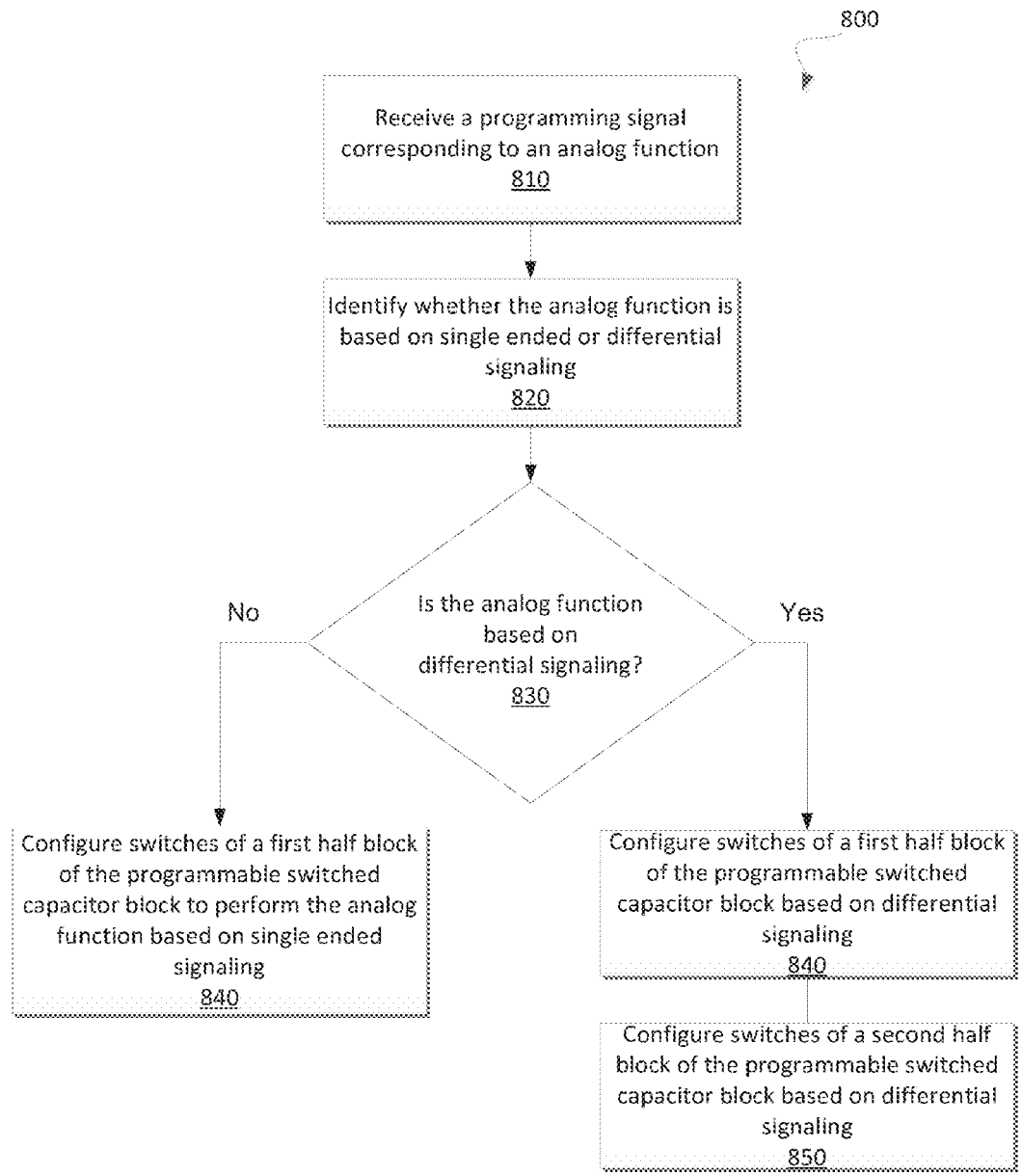
FIG. 8 is a flow diagram of an example method to configure a programmable switched capacitor block based on single ended signal or differential signal functionality associated with an analog function in accordance with some embodiments.

FIG. 8 is a flow diagram of an example method 800 to configure a programmable switched capacitor block based on single ended signal or differential signal functionality associated with an analog function. The method 800 may be performed by processing logic that may include hardware (circuitry, dedicated logic, etc.), software (such as is run on a computing system or a dedicated machine), firmware (embedded software), or any combination thereof. In some embodiments, the method 800 may be performed by the programmable switched capacitor blocks 222, 300, or 500 of FIGS. 2, 3, and 5. For example, the method 800 may be performed by processing logic (e.g., hardware, circuitry, etc.) of a programmable switched capacitor block or a processing device coupled to the programmable switched capacitor block.

As shown in FIG. 8, the method may begin by processing logic receiving a programming signal corresponding to an analog function (block 810). Examples of an analog function include, but are not limited to, discrete time analog functions such as a $1^{st}$ order sigma delta modulator of variable resolution, a second order sigma delta modulator, incremental and/or continuous time functions, a variable again analog to digital converter (ADC), a variable resolution digital to analog converter (DAC) and a multiplying DAC, a variable gain DAC, an automatic gain control in ADC and DAC modes, a programmable gain amplifier, a sub-sampling mixer, a $1^{st}$ order filter, a higher order filter associated with chaining, a $1^{st}$ order differential signal path, a higher order differential signal path associated with chaining, a 2nd order single ended signal, time interleaved differencing operations, modulation of analog input signals, a track and hold amplifier, a sample and hold amplifier, differential to single ended signal conversion, relaxation oscillator, a two-phase or three phase control or sampling system with an adjustable sample aperture, various filters associated with a biquad mode, an adjustable Return to Zero signal for low offset outputs, a self-testing function, a summer, an integrator, and a clocked comparator. The processing logic may further identify whether the analog function is based on single ended or differential signaling (block 820). For example, the processing logic may identify whether the analog function requires an output signal to be a single ended signal or requires the output signal to be a differential signal. Accordingly, the processing logic may determine whether the analog function is based on differential signaling (block 830). If the analog function is not based on differential signaling (e.g., the output of the analog function is to be a single ended signal), then the processing logic may configure switches of a first half block of the programmable switched capacitor block to perform the analog function based on the single ended signaling (block 830). For example, the switches of the first half block of the programmable switched capacitor may be opened and/or closed to output a single ended signal based on the analog function and the second half block of the same programmable switched capacitor may not be configured based on the analog function. However, if the analog signal is based on differential signaling, then the processing logic may configure switches of the first half block of the programmable switched capacitor block based on the differential signaling (block 840) as well as configure the switches of the second half block of the same programmable switched capacitor block based on the differential signaling (block 850).

In some embodiments, when the analog function is based on the single ended signaling, then only one half block of the programmable switched capacitor block may be used to implement the analog function. Furthermore, the comparator of the half block that is used may not receive the output voltage signal of the other half block of the programmable switched capacitor block. Additionally, the other half block that is not used from the same programmable switched capacitor block may be used to implement another analog function. Accordingly, each half block may independently implement different analog functions that are each based on single ended signaling. However, when the analog function is based on differential signaling, then both half blocks of the same programmable switched capacitor block may be used to implement the analog function that is based on differential signaling. For example, the positive terminal of op-amps from both of the half blocks may be connected to the same reference voltage signal by the closing of respective switches. Furthermore, the same signal may be connected to the left side capacitor plate of each capacitor in a particular capacitor branch in each of the half blocks. For example, a first switch may be closed to connect a first signal to the left side capacitor plate in a first branch of the first half block and a second switch may be closed to connect the same first signal to the left side capacitor plate in a first branch of the second half block. Similarly, a second signal may be connected to the left side capacitor plate in a second branch of the first half block and the second branch of the second half block. In operation, the differential signaling may be accomplished by sampling an input voltage signal (e.g., $Vi_{n00}$ for the first half block and $V_{in10}$ for the second half block) and closing a switch to couple the same signal (e.g., the ComA signal) to the left side capacitor plate in each of the first half block and the second half block. In some embodiments, any asymmetry in the sampling of the input voltage signals (e.g., between the input voltage signal for the first half block and the input voltage signal for the second half block) may be negated by equally distributing the charge to the capacitors in both the first half block and the second half block. Accordingly, the differential signaling may be implemented by configuring switches in both the first half block and the second half block so that a positive terminal of op-amps in each of the first half block and second half block are connected to the same reference voltage signal and the left side capacitor plates of corresponding capacitors in corresponding capacitor branches are connected to at least one other same signal.

The embodiments described herein may be used to provide a programmable switched capacitor block that may be used to implement various analog functions. The use of the programmable switched capacitor block may improve the flexibility of an analog subsystem used in a processing device and may provide a higher amount of potential functionality within the same silicon area as opposed to having multiple fixed functional analog blocks each dedicated to a particular analog function. The programmable switched capacitor block may include multiple switches that may be programmed or configured to perform different analog functions based on the switches that are programmed or configured to be opened and/or closed. The programming of the programmable switched capacitor block may be set using various techniques, such as firmware executing on a microcontroller unit.

Embodiments of the present disclosure, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the disclosure has been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. An apparatus comprising:
    a first input to receive a programming signal corresponding to an analog function that is based on either single ended signaling or differential signaling;
    a first analog block coupled to the first input, the first analog block comprising a first switched capacitor branch comprising a first set of switched capacitors, a second switched capacitor branch comprising a second set of switched capacitors, a first operational amplifier, and a first capacitor coupled between an output of the first operational amplifier and an input of the first operational amplifier, wherein the first switched capacitor branch receives a first input signal and the second switched capacitor branch receives a second input signal; and
    a second analog block coupled to the second input, the second analog block comprising a third switched capacitor branch comprising a third set of switched capacitors, a fourth switched capacitor branch comprising a fourth set of switched capacitors, a second operational amplifier, and a second capacitor coupled between an output of the second operational amplifier and an input of the second operational amplifier, wherein the third switched capacitor branch receives a third input signal and the fourth switched capacitor branch receives a fourth input signal,
    wherein, in response to the analog function being based on the single ended signaling, a first switch associated with the first switched capacitor branch or the second switched capacitor branch is configured to output a first single ended signal,
    wherein, in response to the analog function being based on the differential signaling, both the first switch and a second switch associated with the third switched capacitor branch or the fourth switched capacitor branch are configured to output a differential signal, and
    wherein, when the analog function is associated with the differential signal, the first analog block outputs a first complementary signal of the differential signal and the second analog block outputs a second complementary signal of the differential signal.

2. The apparatus of claim 1, wherein the second switch is configured when the analog function is further associated with a second single ended signal, and wherein the first analog block outputs the first single ended signal using the first switched capacitor branch or the second switched capacitor branch and the second analog block outputs the second single ended signal using the third switched capacitor branch or the fourth switched capacitor branch.

3. The apparatus of claim 2, wherein the second single ended signal is associated with a different voltage reference than the first single ended signal.

4. The apparatus of claim 1, wherein the configuring of the switches is based on opening or closing of the switches.

5. The apparatus of claim 1, wherein at least one switch of the first analog block is configured based on a number of bits associated with the analog function when the analog function is associated with the first single ended signal.

6. The apparatus of claim 1, wherein at least one switch of the second analog block is configured to be closed when the analog function is associated with the signal ended signal and requires an additional input corresponding to the second analog block, and wherein the at least one switch is configured to be open when the analog function is associated with the signal ended signal and does not require the additional input.

7. The apparatus of claim 1, wherein a positive terminal of the first operational amplifier of the first analog block and a positive terminal of the second operational amplifier of the second analog block are coupled to a same reference voltage signal by configuring of another switch of the first analog block and another switch of the second analog block.

8. A method comprising:
    receiving a programming signal corresponding to an analog function that is based on either single ended signaling or differential signaling;
    configuring a first analog block to receive a first input signal and a second input signal and to transmit a first output signal by configuring a first switch of the first analog block based on the analog function, wherein the first switch is associated with a first switched capacitor branch comprising a first set of switched capacitors, a second switched capacitor branch comprising a second set of switched capacitors, a first operational amplifier, and a first capacitor coupled between an output of the first operational amplifier and an input of the first operational amplifier, wherein the first switched capacitor branch receives the first input signal and the second switched capacitor branch receives the second input signal; and configuring a second analog block to receive a third input signal and a fourth input signal and to transmit a second output signal by configuring a second switch of the second analog block based on the analog function, wherein the second switch is associated with a third switched capacitor branch comprising a third set of switched capacitors, a fourth switched capacitor branch comprising a fourth set of switched capacitors, a second operational amplifier, and a second capacitor coupled between an output of the second operational amplifier and an input of the second operational amplifier, wherein the third switched capacitor branch receives the third input signal and the fourth switched capacitor branch receives the fourth input signal, wherein, in response to the analog function being based on the single ended signaling, the first switch is configured to output a first single ended output signal comprising the first output signal and, in response to the analog function being based on the differential signaling, both the first switch and the second switch are configured to output a differential output signal comprising the first output signal and the second output signal, and wherein, when the analog function is associated with the differential output signal, the first output signal is a first complementary signal of the differential output signal and the second output signal is a second complementary signal of the differential output signal.

9. The method of claim 8, wherein the second switch is configured when the analog function is further associated with a second single ended output signal, and wherein the first analog block outputs the first single ended signal using the first switched capacitor branch or the second switched capacitor branch and the second analog block outputs the second single ended signal using the switched capacitor branch or the second switched capacitor branch.

10. The method of claim 9, wherein the second single ended output signal is associated with a different voltage reference than the first single ended output signal.

11. The method of claim 8, wherein the configuring of the first switch is based on opening or closing of the first switch.

12. The method of claim 8, wherein at least one switch of the first analog block is configured based on a number of bits associated with the analog function when the analog function is associated with the first single ended output signal.

13. The method of claim 8, wherein the second switch is configured to be closed when the analog function requires an additional input corresponding to the second analog block, and wherein the second switch is configured to be open when the analog function does not require the additional input.

14. The method of claim 8, wherein the configuring of the first analog block and the configuring of the second analog block comprises a positive terminal of the first operational amplifier of the first analog block and a positive terminal of the second operational amplifier of the second analog block being coupled to a same reference voltage signal by configuring of another switch of the first analog block and another switch of the second analog block.

15. A system comprising:
a processing device to generate a programming signal corresponding to an analog function that is based on either single ended signaling or differential signaling;
a first analog block comprising a first switched capacitor branch comprising a first set of switched capacitors, a second switched capacitor branch comprising a second set of switched capacitors, a first operational amplifier, and a first capacitor coupled between an output of the first operational amplifier and an input of the first operational amplifier, wherein the first branch receives a first input signal and the second branch receives a second input signal; and
a second analog block comprising a third switched capacitor branch comprising a third set of switched capacitors, a fourth switched capacitor branch comprising a fourth set of switched capacitors, a second operational amplifier, and a second capacitor coupled between an output of the second operational amplifier and an input of the second operational amplifier, wherein the third switched capacitor branch receives a third input signal and the fourth switched capacitor branch receives a fourth input signal,
wherein, in response to the analog function being based on the single ended signaling, a first switch associated with the switched capacitor branch or the second switched capacitor branch is configured to output a first single ended signal,
wherein, in response to the analog function being based on the differential signaling, both the first switch and a second switch associated with the third switched capacitor branch or the fourth switched capacitor branch are configured to output a differential signal, and
wherein, when the analog function is associated with the differential signal, the first analog block outputs a first complementary signal of the differential signal and the second analog block outputs a second complementary signal of the differential signal.

16. The system of claim 15, wherein the second switch is configured when the analog function is further associated with a second single ended signal, and wherein the first analog block outputs the first single ended signal using the switched capacitor branch or the second switch capacitor branch and the second analog block outputs the second single ended signal using the third switched capacitor branch or the fourth switched capacitor branch.

17. The system of claim 16, wherein the second single ended signal is associated with a different voltage reference than the first single ended signal.

18. The system of claim 15, wherein the configuring of the switches is based on opening or closing of the switches.

19. The system of claim 15, wherein at least one switch of the first analog block is configured based on a number of bits associated with the analog function when the analog function is associated with the first single ended signal.

20. The system of claim 15, wherein a positive terminal of the first operational amplifier of the first analog block and a positive terminal of the second operational amplifier of the second analog block are coupled to a same reference voltage signal by configuring of another switch associated with the first analog block and another switch associated with the second analog block.

* * * * *